United States Patent
Endo et al.

(10) Patent No.: US 6,958,909 B2
(45) Date of Patent: Oct. 25, 2005

(54) ELECTRONIC APPARATUS

(75) Inventors: Ryoichi Endo, Kanagawa-ken (JP); Takashi Ichihara, Kanagawa-ken (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 118 days.

(21) Appl. No.: 10/664,399

(22) Filed: Sep. 19, 2003

(65) Prior Publication Data

US 2005/0063155 A1    Mar. 24, 2005

(51) Int. Cl.$^7$ .............................................. H05K 7/20
(52) U.S. Cl. ...................... 361/695; 361/694; 361/690; 165/104.34
(58) Field of Search ................................ 361/676, 678, 361/687, 690, 692, 694, 695; 454/184–186; 165/80.3, 80.4, 104.34

(56) References Cited

U.S. PATENT DOCUMENTS

| | | | |
|---|---|---|---|
| 4,926,291 A * | 5/1990 | Sarraf ........................ | 361/685 |
| 5,208,730 A * | 5/1993 | Tracy ......................... | 361/687 |
| 5,713,790 A * | 2/1998 | Lin ............................ | 454/184 |
| 5,788,566 A * | 8/1998 | McAnally et al. ........... | 454/184 |
| 5,943,210 A * | 8/1999 | Lee et al. .................... | 361/697 |
| 5,953,208 A * | 9/1999 | Katsui ........................ | 361/697 |
| 6,061,237 A * | 5/2000 | Sands et al. ................ | 361/695 |
| 6,183,214 B1 * | 2/2001 | Ko .............................. | 417/360 |
| 6,236,564 B1 * | 5/2001 | Fan ............................ | 361/695 |
| 6,244,953 B1 * | 6/2001 | Dugan et al. ............... | 454/184 |
| 6,272,022 B1 * | 8/2001 | Ferranti et al. ............. | 361/818 |
| 6,304,445 B1 * | 10/2001 | Bollesen ..................... | 361/697 |
| 6,315,656 B1 * | 11/2001 | Pawlowski .................. | 454/184 |
| 6,351,380 B1 * | 2/2002 | Curlee et al. ............... | 361/695 |
| 6,549,406 B1 * | 4/2003 | Olesiewicz et al. ......... | 361/695 |
| 6,556,437 B1 * | 4/2003 | Hardin ........................ | 361/687 |
| 6,579,168 B1 * | 6/2003 | Webster et al. ............. | 454/184 |

* cited by examiner

Primary Examiner—Anatoly Vortman
(74) Attorney, Agent, or Firm—Pearne & Gordon LLP

(57) ABSTRACT

Herein disclosed is an electronic apparatus, comprising: a housing; a mounting plate having an electronic device mounted thereon and fixedly connected with the housing, the mounting plate being formed with a through bore; a supporting plate fixedly connected with at least one of the housing and the mounting plate and formed with a through bore; a cooling fan device intervening between and supported by the mounting plate and the supporting plate, and adapted to ventilate the housing through the through bore of the mounting plate and the through bore of the supporting plate; and a resilient member disposed between the cooling fan device and the mounting plate and between the cooling fan device and the supporting plate to absorb vibrations of the cooling fan device while the cooling fan device is being driven to ventilate the housing to cool the electronic device.

10 Claims, 7 Drawing Sheets

ELECTRONIC APPARATUS

BACKGROUND OF THE INVENTION

1. Field of the Invention

The present invention relates to an electronic apparatus, and more particularly to an electronic apparatus having an electronic device and a cooling fan device assembled therein.

2. Description of the Related Art

Up until now, there have been proposed a wide variety of conventional electronic apparatuses available for, for example, an audio device, a car navigation device, or the like to be assembled in an automotive vehicle with a view of enhancing the convenience of the vehicle passengers.

One typical example of the conventional electronic apparatus of this type comprises a housing, a printed circuit board fixedly connected with the housing, an electronic device such as, for example, a disk drive unit, mounted on the printed circuit board, and a cooling fan device soldered to the printed circuit board. The cooling fan device is operative to ventilate the housing to cool the elements and parts forming part of the electronic device for the purpose of preventing the electronic device from being heated over an allowable temperature level. Though it has been described in the above that the cooling fan device is soldered to the printed circuit board, the cooling fan device may be directly fastened to the housing by a plurality of fastening screws. The cooling fan device vibrates while the cooling fan device is being driven to ventilate the housing to cool the elements and parts forming part of the electronic device.

The conventional electronic apparatus as previously mentioned, however, encounters a drawback that such vibrations of the cooling fan device tend to be transmitted to the electronic device and the housing through the soldered portion soldering the cooling fan device to the printed circuit board or the fastening screws fastening the cooling fan device directly to the housing while the cooling fan device is being driven to ventilate the housing, thereby causing unpleasant noises to operators' ears. Furthermore, the conventional electronic apparatus as previously mentioned encounters another drawback that the conventional electronic apparatus is required to have a solder portion soldered to the printed circuit board or a plurality of fastening screws screwed into the housing to secure the cooling fan device to the housing, thereby making the conventional electronic apparatus complex in construction and difficult to assemble.

SUMMARY OF THE INVENTION

It is, therefore, an object of the present invention to provide an electronic apparatus, which is noiseless in operation.

It is another object of the present invention to provide an electronic apparatus, which is simple in construction and easy to assemble.

It is a further object of the present invention to provide an electronic apparatus, which can reduce noises caused by the vibration of the cooling fan device.

It is a still further object of the present invention to provide an electronic apparatus, which can reduce the need of the fastening screw or the solder portion.

In accordance with a first aspect of the present invention, there is provided an electronic apparatus, comprising: a housing; a mounting plate having an electronic device mounted thereon and fixedly connected with the housing, the mounting plate being formed with a through bore; a supporting plate fixedly connected with at least one of the housing and the mounting plate and formed with a through bore; a cooling fan device intervening between and supported by the mounting plate and the supporting plate, and adapted to ventilate the housing through the through bore of the mounting plate and the through bore of the supporting plate; and a resilient member disposed between the cooling fan device and the mounting plate and between the cooling fan device and the supporting plate to absorb vibrations of the cooling fan device while the cooling fan device is being driven to ventilate the housing to cool the electronic device.

In the aforementioned electronic apparatus, the cooling fan device may have a first surface and a second surface opposing to and spaced apart from each other, the mounting plate and the supporting plate may have respective complementary portions forming in cooperation a holding portion for holding the cooling fan device, and at least the first surface and the second surface of the cooling fan device may be opposing to and held in resiliently pressing contact with the holding portion with the resilient member disposed therebetween. The mounting plate may include a first holding section, the supporting plate may include a second holding section, the first holding section and the second holding section may collectively serve as the holding portion. The cooling fan device has a first contact surface and a second contact surface opposing to and spaced apart from each other, a top surface and a bottom surface opposing to and spaced apart from each other and substantially in perpendicular relationship with the first contact surface, and a pair of side surfaces opposing to and spaced apart from each other and substantially in perpendicular relationship with the first contact surface and the bottom surface. The first contact surface, the side surfaces, and the bottom surface may be opposing to and held in pressing contact with the first holding section of the mounting plate, and the second contact surface and the top surface may be opposing to and held in pressing contact with the second holding section of the supporting plate.

In the aforementioned electronic apparatus, at least one of the side surfaces may be opposing to and held in pressing contact with both of the first holding section of the mounting plate and the second holding section of the supporting plate. The mounting plate may be fixedly connected with the supporting plate under the state that the cooling fan device and the resilient member are intervening between and supported by the mounting plate and the supporting plate. The housing may be partly constituted by one of the mounting plate and the supporting plate. The one of the mounting plate and the supporting plate may constitute a plane of the housing, and the plane may have a base portion and a protruded portion integrally formed with and protruded outwardly of the base portion to have the cooling fan device partly received therein.

In accordance with a second aspect of the present invention, the resilient member has a first resilient portion disposed between the cooling fan device and the mounting plate and a second resilient portion disposed between the cooling fan device and the supporting plate, and the first resilient portion and the second resilient portion are connected with each other. The resilient member may have an inserting portion to have the cooling fan device slidably received therethrough. In the aforementioned electrics apparatus, the cooling fan device may be operative to exhaust the air in the housing. The electronic device may be a disk drive unit.

In accordance with a third aspect of the present invention, the electronic apparatus is to be assembled in a vehicle.

BRIEF DESCRIPTION OF THE DRAWINGS

The features and advantages of an electronic apparatus according to the present invention will be more clearly understood from the following description taken in conjunction with the accompanying drawings in which.

DESCRIPTION OF THE EMBODIMENTS

Figure 1:
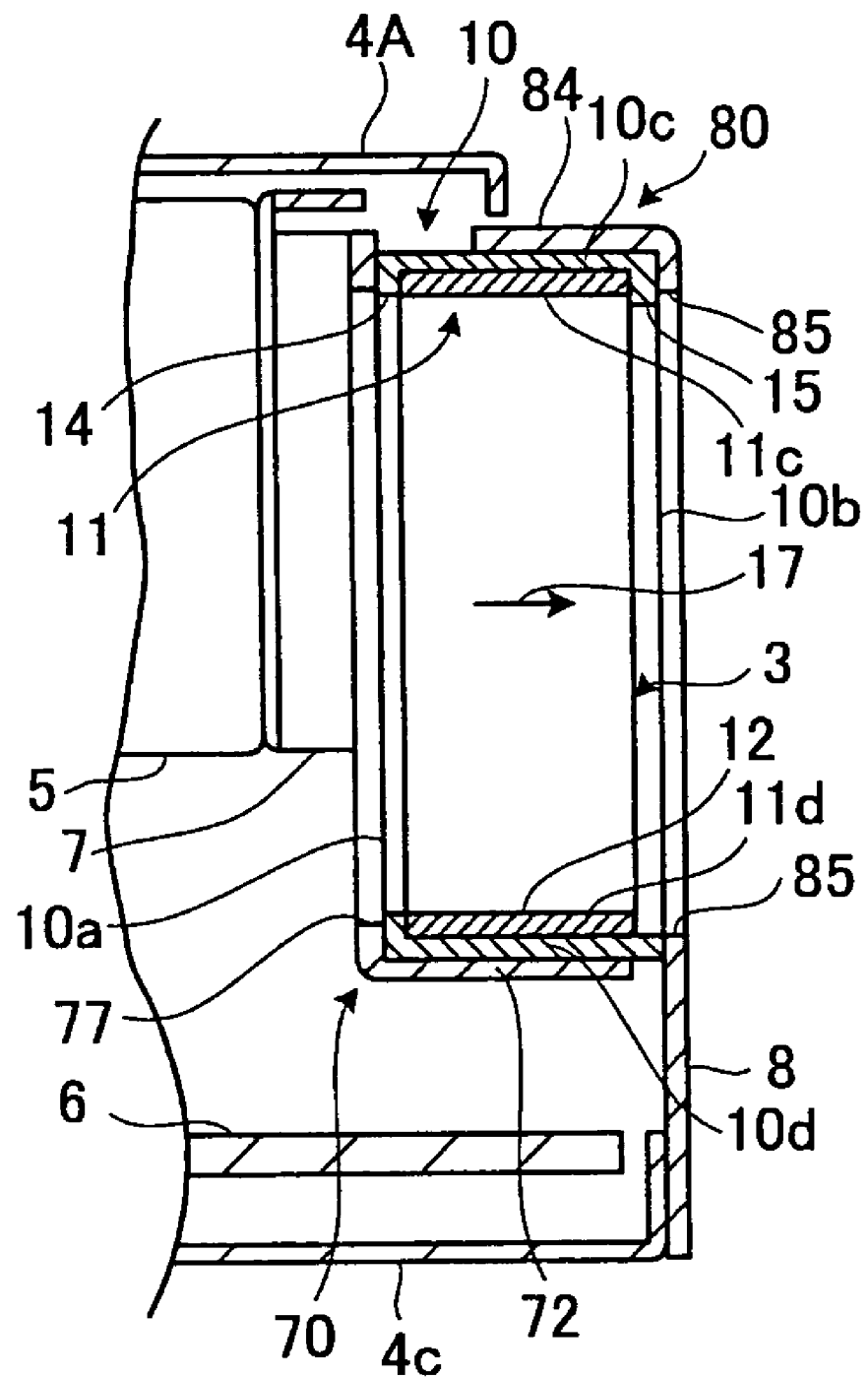
FIG. 1 is an enlarged fragmentary cross-sectional view showing a cooling fan device intervening between and supported by a mounting plate and a supporting plate forming part of an electronic apparatus according to the present invention.

Referring now to the drawings, in particular to FIGS. 1 to 7, there is shown the preferred embodiments of the electronic apparatus according to the present invention. Throughout the following detailed description, similar reference characters and numbers refer to respective similar elements in all figures of the drawings.

The construction of the preferred embodiment of the electronic apparatus 1 according to the present invention will firstly be described hereinafter with reference to FIGS. 2 to 4.

Figure 2:
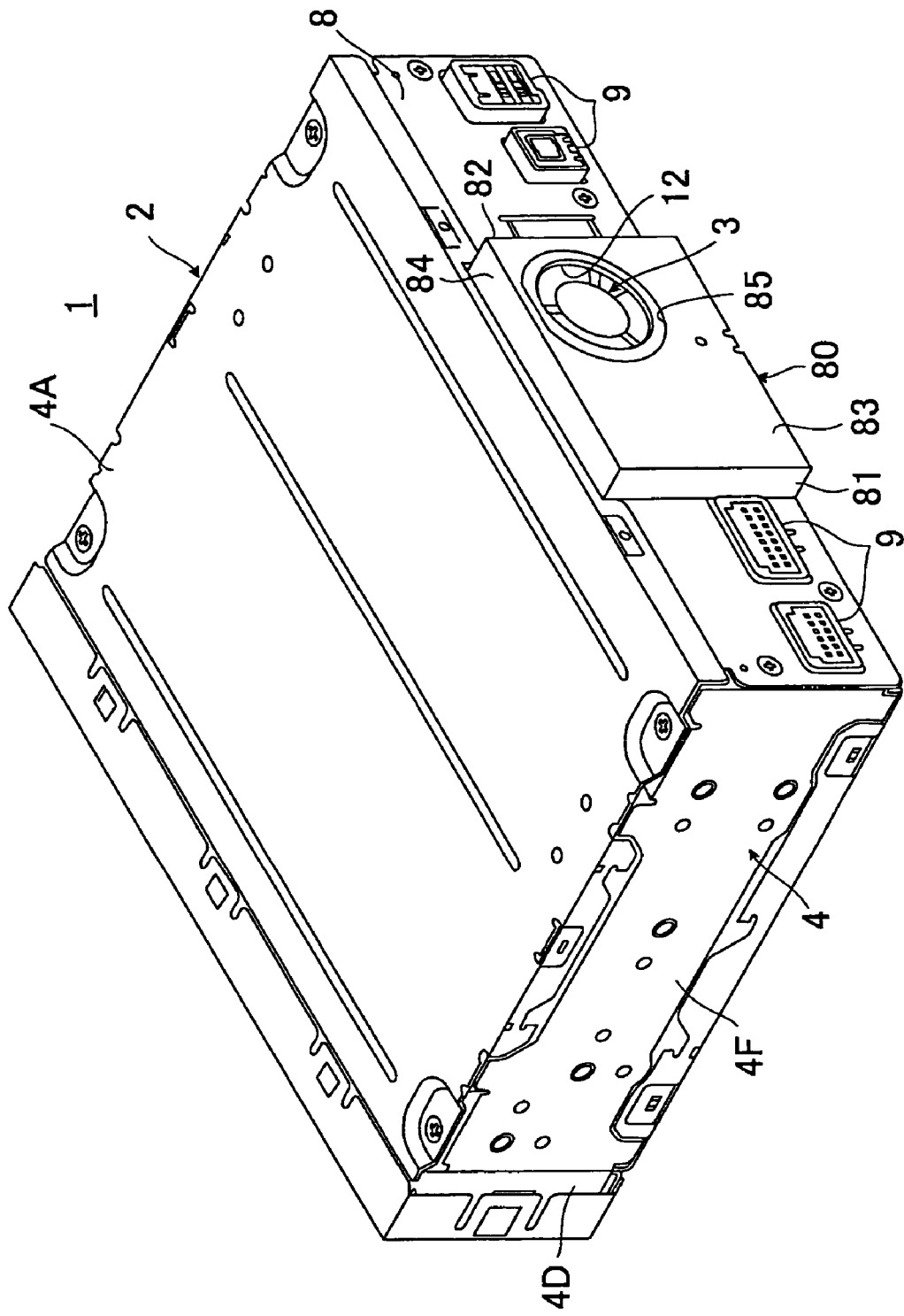
FIG. 2 is an oblique perspective view showing the electronic apparatus according to the present invention.
Figure 3:
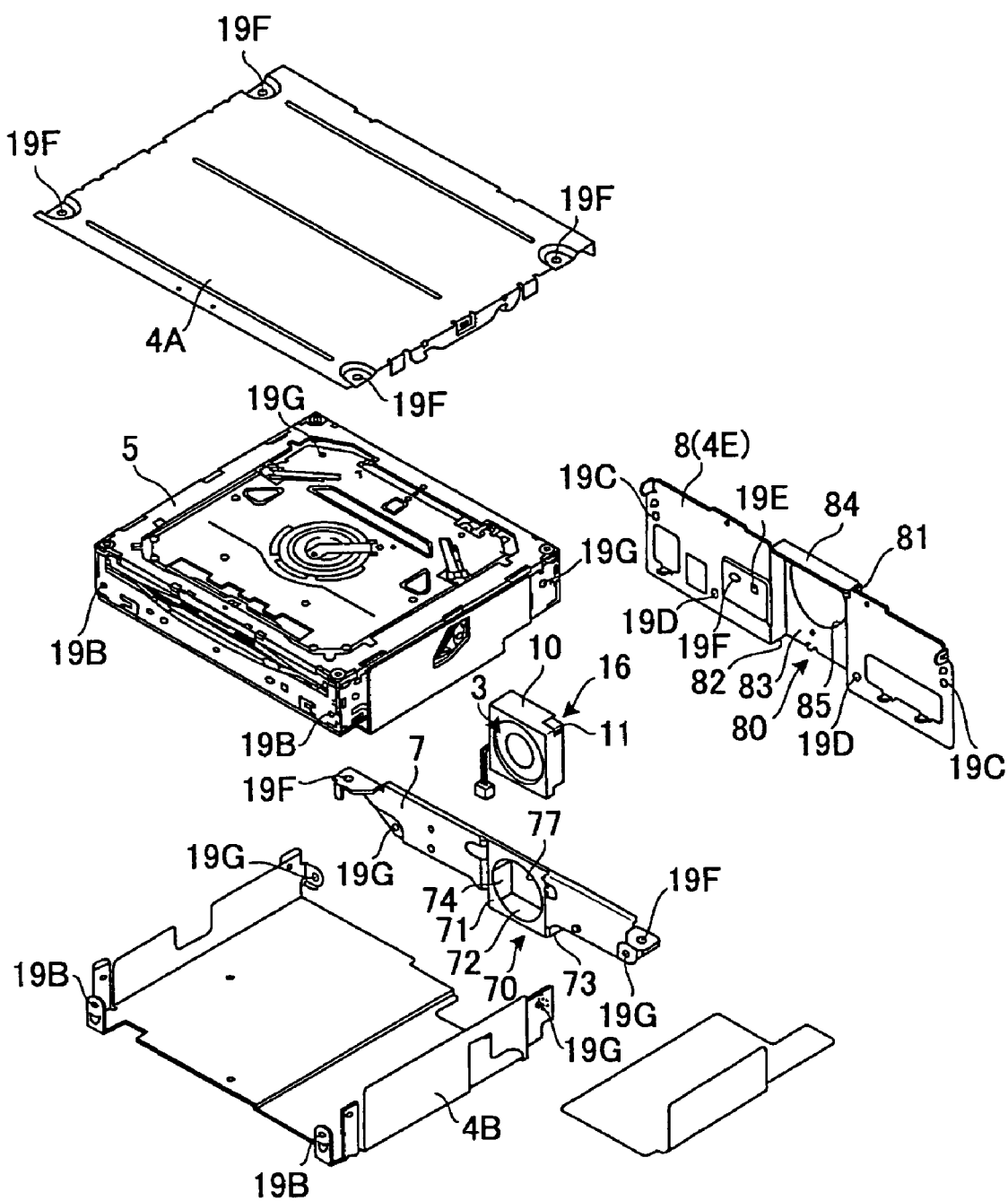
FIG. 3 is an exploded perspective view showing the cooling fan device, an electronic device, and other constituent elements forming part of the electronic apparatus according to the present invention.
Figure 4:
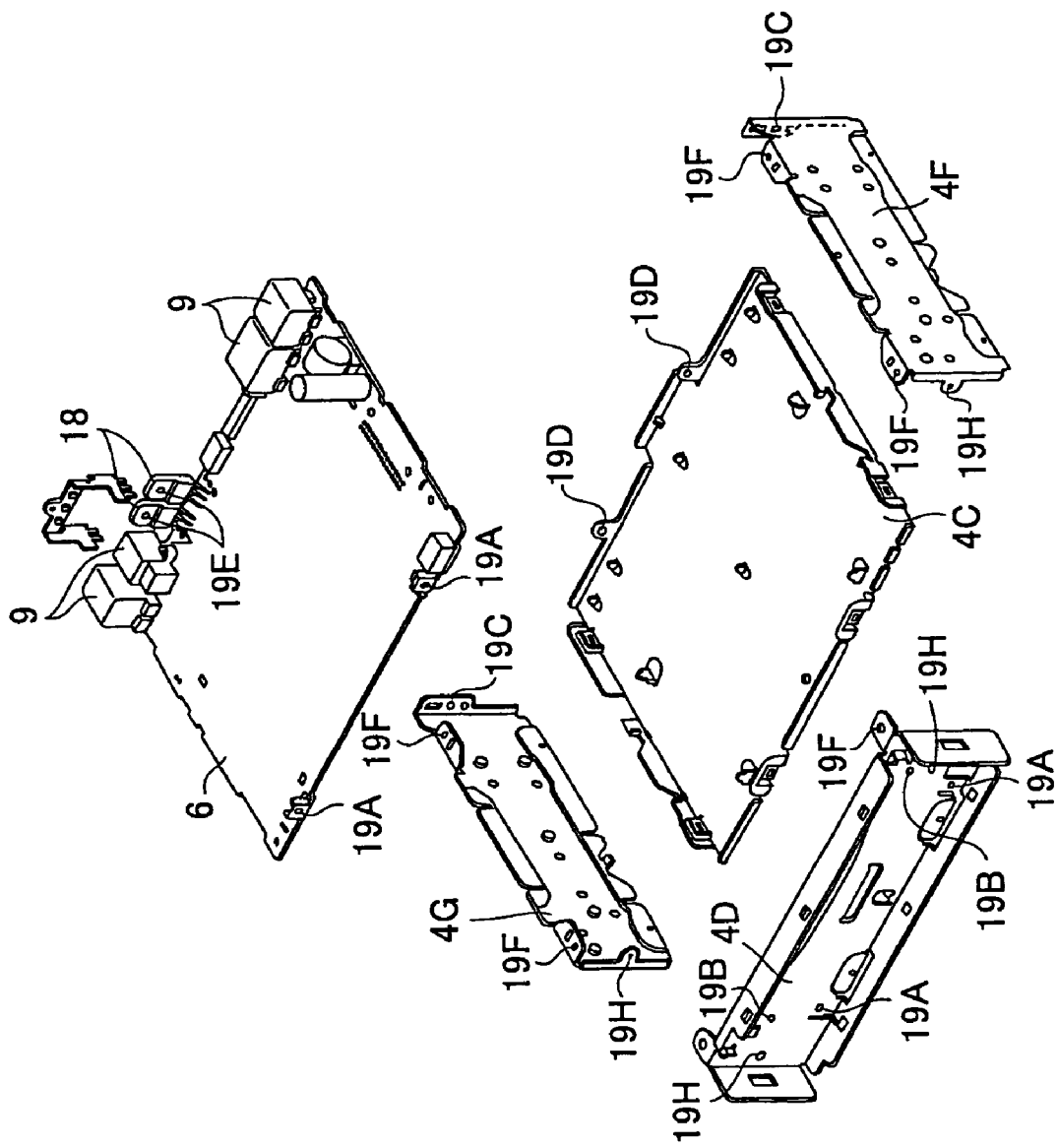
FIG. 4 is an exploded perspective view showing constituent elements forming part of the electronic apparatus but not shown in FIG. 3.
Figure 5:
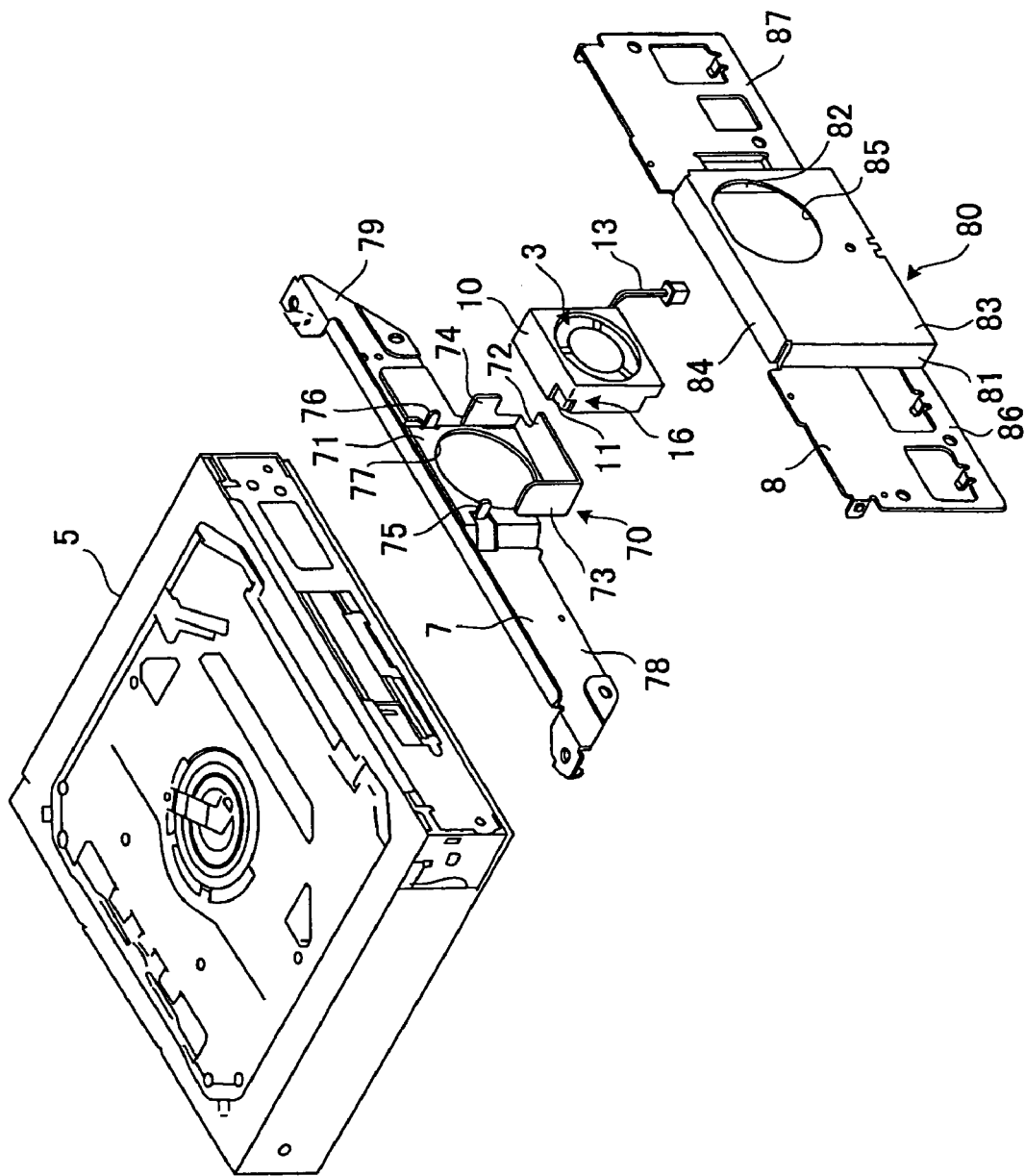
FIG. 5 is an exploded perspective view showing the electronic device and the cooling fan device intervening between the mounting plate and the supporting plate forming part of the electronic apparatus according to the present invention.
Figure 7:
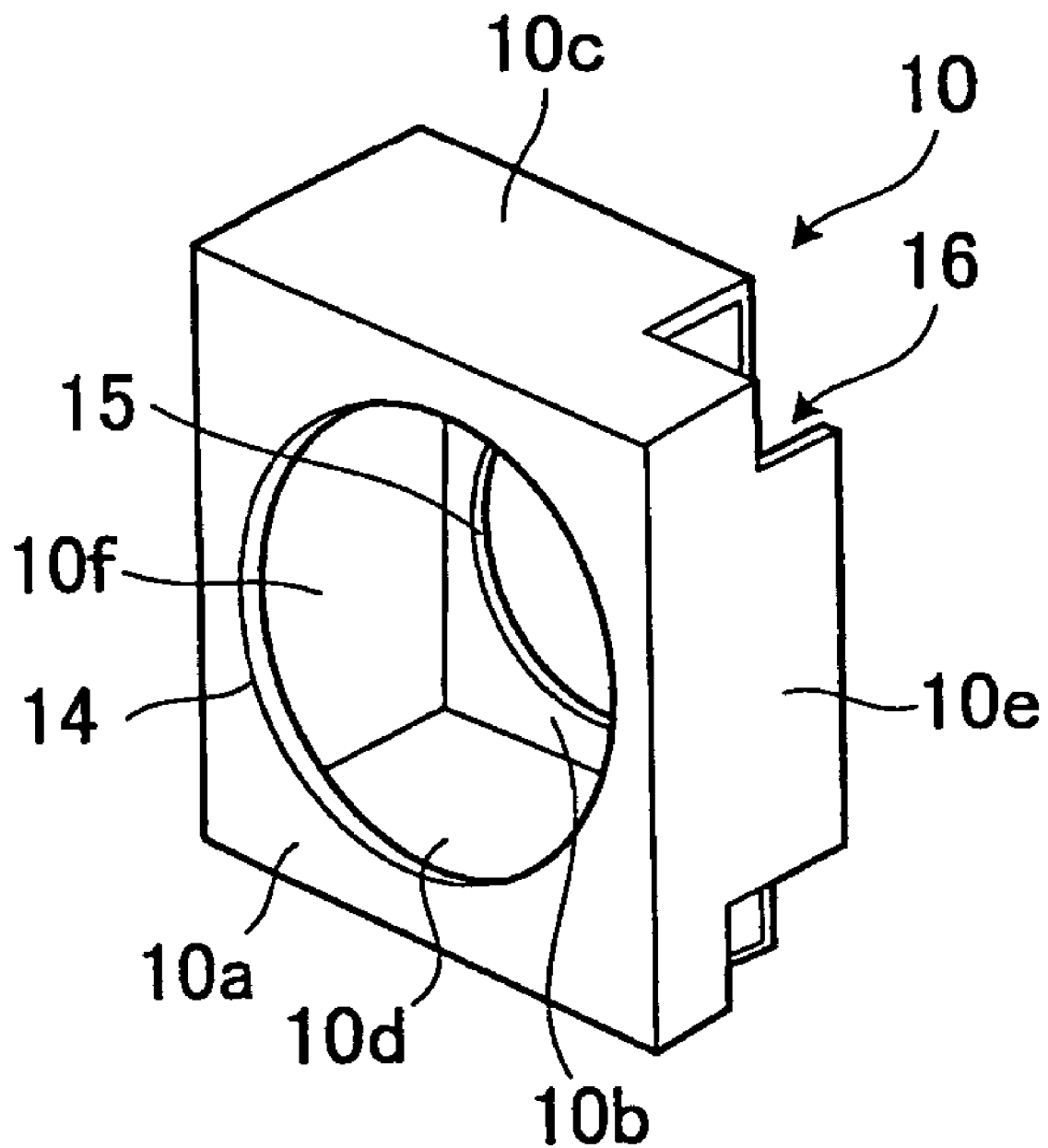
FIG. 7 is an oblique perspective view showing a resilient member forming part of the electronic apparatus according to the present invention.

The electronic apparatus 1 is shown in FIGS. 2 to 4 as comprising a housing 4, a mounting plate 7, a supporting plate 8, a cooling fan device 3, and a resilient member 10. The housing 4 includes an upper panel 4A and a chassis panel 4B opposing to and spaced apart from each other. The housing 4 further includes a front panel 4D and a rear panel 4E opposing to and spaced apart from each other, and substantially in perpendicular relationship with the upper panel 4A. The housing 4 further includes a pair of side panels 4F and 4G opposing to and spaced apart from each other, and substantially in perpendicular relationship with the upper panel 4A and the front panel 4D. As best shown in FIG. 3, the mounting plate 7 has an electronic device 5 mounted thereon and fixedly connected with the chassis panel 4B of the housing 4. The mounting plate 7 is formed with a through bore 77. Preferably, the electronic device 5 should be a disk drive unit such as for example a Digital Versatile Disc player, hereinlater simply referred to as a "DVD player", a Compact Disc player, hereinlater simply referred to as a "CD player", a Compact Disc Read Only Memory drive unit, hereinlater simply referred to as a "CD-ROM drive unit", a Mini Disc drive unit, hereinlater simply referred to as a "MD drive unit", or the like. In the present embodiment, it is hereinlater assumed that the electronic device 5 is a DVD player, and the electronic apparatus 1 is to be assembled in an automotive vehicle. The supporting plate 8 is fixedly connected with at least one of the housing 4 and the mounting plate 7 and formed with a through bore 85. In the present embodiment, the mounting plate 8 is screwed to the side panels 4F and 4G of the housing 4. The cooling fan device 3 is intervening between and supported by the mounting plate 7 and the supporting plate 8. The cooling fan device 3 is adapted to ventilate the housing 4 through the through bore 77 of the mounting plate 7 and the through bore 85 of the supporting plate 8. As best shown in FIG. 7, the electronic apparatus 1 further comprises a resilient member 10 disposed between the cooling fan device 3 and the mounting plate 7 and between the cooling fan device 3 and the supporting plate 8 to absorb vibrations of the cooling fan device 3 while the cooling fan device 3 is being driven to ventilate the housing 4 to cool the electronic device 5. The resilient member 10 may be made of for example rubber material.

In the electronic apparatus 1 according to the present invention, the housing 4 is partly constituted by one of the mounting plate 7 and the supporting plate 8. In present embodiment, the supporting plate 8 constitutes a plane of the housing 4. Returning to FIG. 2 to 4, the rear panel 4E of the housing 4 is constituted by a supporting plate 8. The electronic apparatus 1 further comprises a printed circuit board 6. The housing 4 further includes a lower panel 4C having the printed circuit board 6 secured thereto. This means that the printed circuit board 6 has a front portion screwed to the front panel 4D of the housing 4 at screw points 19A. The electronic device 5 and the chassis panel 4B of the housing 4 have respective front portions screwed to the front panel 4D of the housing at respective screw points 19B. The side panels 4F and 4G have respective rear portions screwed to the supporting plate 8 at respective screw points 19C. The lower panel 4C has a rear portion secured to the supporting plate 8 at screw points 19D. The printed circuit board 6 has a rear portion having an electronic part 18 secured thereto and screwed to the supporting plate 8 at screw points 19E. The electronic part 18 of the printed circuit board 6 is adapted to drive and control the cooling fan device 3 and the DVD player 5. The upper panel 4A is screwed to the DVD player 5, the side plates 4F and 4G the front panel 4D and the mounting plate 7 at respective screw points 19F.

As best shown in FIG. 4, the printed circuit board 6 has a connector 9 electrically connected to a power source, not shown in FIG. 4, and a vehicle control unit, not shown in FIG. 4. The power source is adapted to supply power to the cooling fan device 3 and the DVD player 5 through the connector 9 of the printed circuit board 6. The vehicle control unit is operative to receive an input signal from the electronic part 18 and transmit an output signal received to the electronic part 18 through the connector 9 of the printed circuit board 6.

Figure 6:
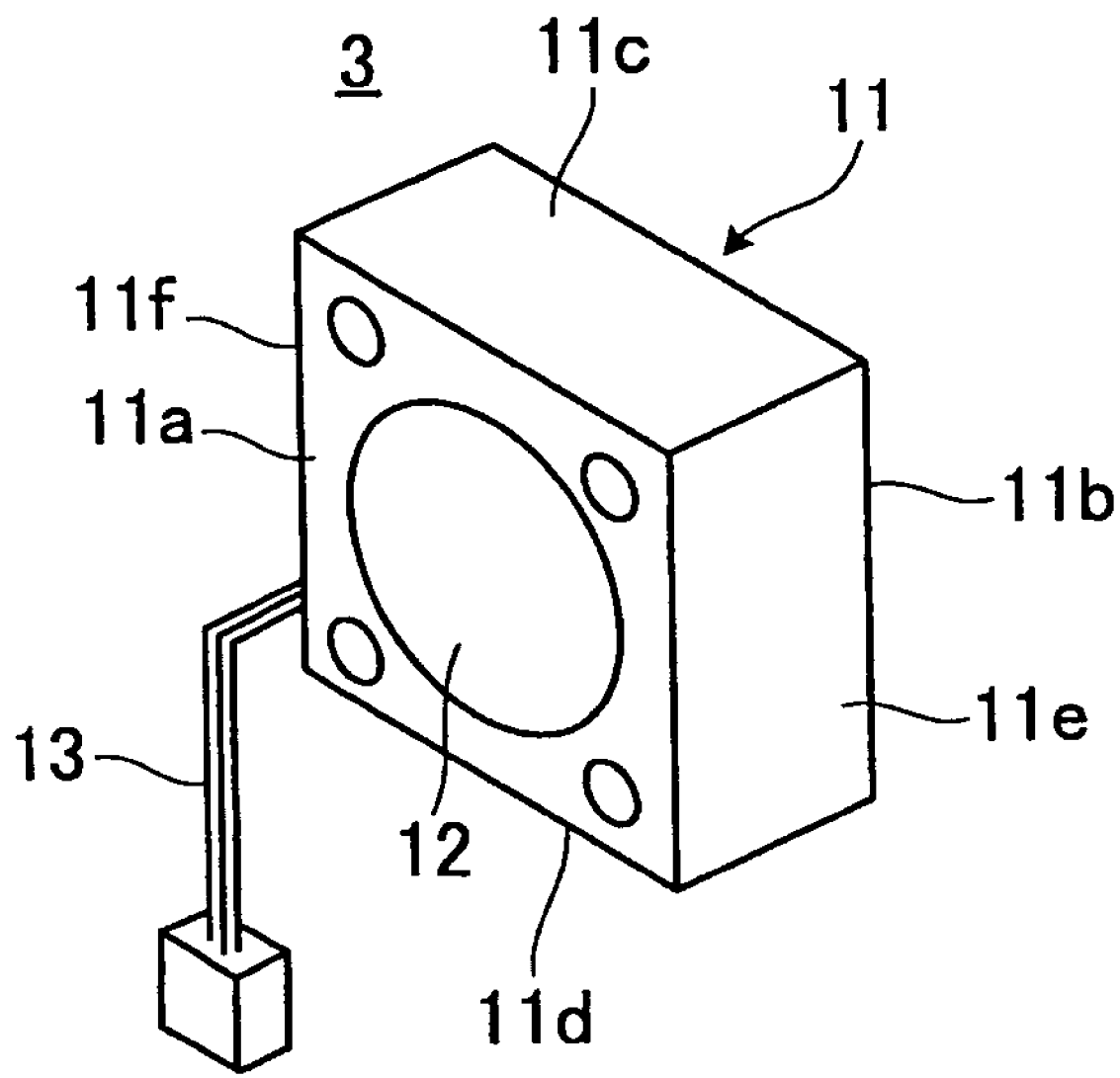
FIG. 6 is an oblique perspective view showing the cooling fan device forming part of the electronic apparatus according to the present invention.

The description hereinlater will be directed to the cooling fan device 3 in detail with reference to FIG. 6.

The cooling fan device 3 comprises a housing 11, a publicly known rotor-type cooling fan, and a drive motor for driving the cooling fan to exhaust the air in the housing 4. The cooling fan and the drive motor are accommodated in the housing 11 and not shown in FIG. 6. The housing 11 of the cooling fan device 3 is in the shape of a rectangular box shape and having a front surface 11a and a rear surface 11b opposing to and spaced apart from each other, a top surface 11c and a bottom surface 11d opposing to and spaced apart from each other and substantially in perpendicular relationship with the front surface 11a, and a pair of side surfaces 11e and 11f opposing to and spaced apart from each other and substantially in perpendicular relationship with the front surface 11a and the bottom surface 11d. The front surface 11a and the rear surface 11b of the housing 11 of the cooling fan device 3 are substantially in the shape of a square shape. The front surface 11a and the rear surface 11b are formed with a through bore 12, thereby making it possible for the cooling fan of the cooling fan device 3 to ventilate the housing therethrough. The through bore 12 is in the form of a circular cross-section shape. The cooling fan device 3 further comprises a wire 13 for connecting the drive motor of the cooling fan drive 3 with the connector 9 of the printed circuit board 6 to supply the electrical power to the drive motor of the cooling fan drive 3.

In the electronic apparatus 1 according to the present invention, the cooling fan device 3 is operative to exhaust the air in the housing 4. This means that the electronic apparatus 1 is designed to permit the cooling fan of the cooling fan device 3 only to exhaust the air heated by the electronic device 5 in the housing 4, thereby preventing the cooling fan of the cooling fan device 3 from blowing the air heated by the electronic device 5 into the housing 4 and heating the elements and parts forming part of the electronic device 5. This leads to the fact that the electronic apparatus 1 according to the present invention makes it possible for the cooling fan device 3 to cool the elements and parts forming part of the electronic device 5 in the housing 4. Though it has been described in the above that the electronic device 5 is a DVD player, the electronic apparatus 1 according to the present invention may comprise any other disk drive unit having a drive motor such as for example, a CD player, a CD-ROM player, a MD drive unit, a Hard Disk drive unit, or the like. From the foregoing description, it is to be understood that the electronic apparatus 1 according to the present invention thus can prevent the drive motor of the disk drive unit from being heated over an allowable temperature level.

The description hereinlater will be directed to the resilient member 10 disposed between the cooling fan device 3 and the mounting plate 7 and between the cooling fan device 3 and the supporting plate 8 in detail with reference to FIG. 7.

The resilient member 10 has a first resilient portion disposed between the cooling fan device 3 and the mounting plate 7 and a second resilient portion disposed between the cooling fan device 3 and the supporting plate 8. The first resilient portion and the second resilient portion are connected with each other. In the present embodiment, the first resilient portion and the second resilient portion are integrally formed with each other. In the present embodiment of the electronic apparatus 1, the resilient member 10 includes a front resilient portion 10a and a rear resilient portion 10b respectively designed to cover the front surface 11a and the rear surface 11b of the housing 11 of the cooling fan device 3, a top resilient portion 10c and a bottom resilient portion 10d respectively designed to cover the top surface 11c and the bottom surface 11d of the housing 11 of the cooling fan device 3, and a pair of side resilient portions 10e and 10f respectively designed to cover the side surfaces 11e and 11f of the housing 11 of the cooling fan device 3. The front and rear resilient portions 10a and 10b are formed with a through bore 14, thereby making it possible for the cooling fan device 3 to ventilate the housing therethrough. The through bore 14 is in the form of a circular cross-section shape. The front and rear resilient portions 10a and 10b, the top and the bottom resilient portions 10c and 10d, and the side resilient portions 10e and 10f are integrally formed with one another. Here, the front and rear resilient portions 10a and 10b, the top and the bottom resilient portions 10c and 10d, and the side resilient portions 10e and 10f in combination constitute a first resilient portion and a second resilient portion according to the present invention. The resilient member 10 thus constructed is substantially in the shape of a rectangular box shape.

In the electronic apparatus 1 according to the present invention, the resilient member 10 has a first resilient portion disposed between the cooling fan device 3 and the mounting plate 7 and a second resilient portion disposed between the cooling fan device 3 and the supporting plate 8, and the first resilient portion and the second resilient portion are connected with each other. The electronic apparatus 1 thus constructed makes it possible for the first resilient portion and the second resilient portion to be integrally formed with each other, thereby enabling to reduce the number of the constituent elements forming part of the electronic apparatus 1 and thus save the cost of the electronic apparatus 1. Further, the electronic apparatus 1 according to the present invention thus constructed makes it easy for the cooling fan device 3 to be covered by the resilient member 10. This leads to the fact that the electronic apparatus 1 thus constructed is simple in construction and easy to assemble.

The resilient member 10 has an inserting portion 16, which will be described hereinlater. The rear resilient portion 10b, the top resilient portion 10c, and the side resilient portions 10e collectively form a first corner, and the rear resilient portion 10b, the bottom resilient portion 10d, and the side resilient portions 10e collectively form a second corner. The first and second corners are chamfered. Furthermore, the chamfered and thus partly remained section of the rear resilient portion 10b is cut off. The chamfered first and second corners and the cut off portion of the rear panel 10b collectively serves as an inserting portion 16 as shown in FIG. 7.

The mounting plate 7 and the supporting plate 8 have respective complementary portions 70 and 80 forming in cooperation a holding portion for holding the cooling fan device 3. The description hereinlater will be directed to the holding portion in detail with reference to FIGS. 3 to 5.

The mounting plate 7 includes a first holding section 70, and the supporting plate 8 includes a second holding section 80. The first holding section 70 and the second holding section 80 collectively serve as a holding portion for holding the cooling fan device 3. The front surface 11a, the side surfaces 11e, 11f, and the bottom surface 11d are opposing to and held in pressing contact with the first holding section 70 of the mounting plate 7, and the rear surface 11b and the top surface 11c are opposing to and held in pressing contact with the second holding section 80 of the supporting plate 8. In the electronic apparatus according to the present invention, the cooling fan device 3 has a first surface and a second surface opposing to and spaced apart from each other, and at least the first surface and the second surface of the cooling fan device 3 are opposing to and held in pressing contact with the holding portion with the resilient member 10 disposed therebetween. Here, the first surface and the second surface of the cooling fan device 3 opposing to and held in pressing contact with the holding portion with the resilient member 10 disposed therebetween should be the front surface 11a and the rear surface 11b of the cooling fan device 3 to be held in resiliently pressing contact with the front resilient portion 10a and the rear resilient portion 10b of the resilient member 10. Alternatively, the first surface and the second surface of the cooling fan device 3 opposing to and held in pressing contact with the holding portion with the resilient member 10 disposed therebetween may be the top surface 11c and the bottom surface 11d of the cooling fan device 3 to be held in resiliently pressing contact with the top resilient portion 10c and the bottom resilient portion 10d of the resilient member 10, or the side surfaces 11e and 11f of the cooling fan device 3 to be held in resiliently pressing contact with the side resilient portions 10e and 10f of the resilient member 10.

The electronic apparatus 1 according to the present invention, in which the cooling fan device 3 has a first surface and a second surface opposing to and spaced apart from each other, the mounting plate 7 and the supporting plate 8 have respective complementary portions forming in cooperation a holding portion for holding the cooling fan device 3, and at least the first surface and the second surface of the cooling fan device 3 are opposing to and held in pressing contact with the holding portion with the resilient member 10 disposed therebetween, ensures that the vibration of the cooling fan device 3 is absorbed by the first surface and the second surface of the cooling fan device 3 opposing to and held in resiliently pressing contact with the holding portion with the resilient member 10, thereby reducing noises caused by the vibration of the cooling fan device.

In the switching apparatus 1 according to the present invention, the cooling fan device 3 has a first contact surface 11a and a second contact surface 11b opposing to and spaced apart from each other, a top surface 11c and a bottom surface 11d opposing to and spaced apart from each other and substantially in perpendicular relationship with the first contact surface 11a, and a pair of side surfaces 11e and 11f opposing to and spaced apart from each other and substantially in perpendicular relationship with the first contact surface 11a and the bottom surface 11d. The first contact surface 11a, the side surfaces 11e and 11f, and the bottom surface 11d are opposing to and held in pressing contact with the first holding section 70 of the mounting plate 7, and the second contact surface 11b and the top surface 11c are opposing to and held in pressing contact with the second holding section 80 of the supporting plate 8. The front surface 11a and the rear surface 11b respectively constitute a first contact surface and a second contact surface according to the present invention.

Furthermore, at least one of the side surfaces 11e and 11f is opposing to and held in pressing contact with both of the first holding section 70 of the mounting plate 7 and the second holding section 80 of the supporting plate 8. The mounting plate 7 is fixedly connected with the supporting plate 8 under the state that the cooling fan device 3 and the resilient member 10 are intervening between and supported by the mounting plate 7 and the supporting plate 8. The one of the mounting plate 7 and the supporting plate 8 constitutes a plane of the housing 4E. The plane has a base portion and a protruded portion integrally formed with and protruded outwardly of the base portion to have the holding section of the one of the mounting plate 7 and the supporting plate 8 snugly received therein. In the present embodiment, the rear panel 4E of the housing 4 is constituted by a supporting plate 8 as described hereinearlier. The rear panel 4E has a pair of base portions 86 and 87 and a protruded portion 80 integrally formed with and protruded outwardly of the base portions 86 and 87 to have the cooling fan device 3 partly received therein.

The second holding section of the supporting plate 8 is constituted by a protruded portion 80. The second holding section 80 will be described hereinlater.

The second holding section 80 includes a pair of side surface portions 81 and 82 opposing to and spaced apart from each other, and a top surface portion 84 substantially in perpendicular relationship with the side surface portions 81 and 82. The side surface portions 81 and 82 are perpendicular relationship with the base portions 86 and 87 of the rear panel 4E. The second holding section 80 further includes a rear surface portion 83 substantially in perpendicular relationship with the side surface portions 81 and 82 and the top surface portion 84. The rear surface portion 83 is in parallel relationship with the base portions 86 and 87 of the rear panel 4E. The top surface portion 84 is integrally formed with the rear surface portion 83. The rear surface portion 83 is integrally formed with the side surface portions 81 and 82. The side surface portions 81 and 82 are respectively integrally formed with the base portions 86 and 87 of the rear panel 4E. The rear surface portion 83 of the second holding section 80 is formed with a through bore 85. The through bore 85 is in the form of a circular cross-section shape. Furthermore, the rear surface portion 83 of the second holding section 80 is formed with a plurality of other through bores having the connector 9 passing therethrough.

In the present embodiment, the mounting plate 7 does not constitute a plane of the housing 4. The mounting plate 7 has a pair of base portions 78 and 79 and a protruded portion 70 integrally formed with and protruded outwardly of the base portions 78 and 79 to have the cooling fan device 3 partly received therein. The first holding section 70 of the mounting plate 7 is constituted by a protruded portion 70. The first holding section 70 will be described hereinlater.

The first holding section 70 includes a front surface portion 71 integrally formed with and substantially flush with the base portions 78 and 79 of the mounting plate 7, a bottom surface portion 72 integrally formed with and substantially in perpendicular relationship with the front surface portion 71, and a pair of side surface portions 73 and 74 opposing to and spaced apart from each other, and integrally formed with and substantially in perpendicular relationship with the bottom surface portion 72. The mounting plate 7 further has a pair of projected portions 75 and 76 respectively arranged substantially in line with and spaced apart from the side surface portions 73 and 74. The front surface portion 71 of the first holding section 70 is formed with a through bore 77. The through bore 77 is in the form of a circular cross-section shape.

In the electronic apparatus 1 according to the present invention, the housing 4 is partly constituted by one of the mounting plate 7 and the supporting plate 8. This leads to the fact that the electronic apparatus 1 according to the present invention makes it possible for the housing 4 to be partly constituted by one of the mounting plate 7 and the supporting plate 8, thereby enabling to reduce the number of the constituent elements forming part of the electronic apparatus 1 and thus save the cost of the electronic apparatus 1. Furthermore, in the electronic apparatus 1 according to the present invention, one of the mounting plate 7 and the supporting plate 8 constitutes a plane of the housing 4, and the plane has a base portion and a protruded portion integrally formed with and protruded outwardly of the base portion to have the cooling fan device 3 partly received therein. This leads to the fact that the electronic apparatus 1 according to the present invention makes it possible for the one of the mounting plate 7 and the supporting plate 8 to constitute a plane of the housing 4 and have the cooling fan device 3 partly received therein, thereby enabling to reduce the number of the constituent elements forming part of the electronic apparatus 1 and thus save the cost of the electronic apparatus 1.

The description hereinlater will be directed to how the cooling fan device 3 is assembled between the mounting plate 7 and the supporting plate 8 forming part of the electronic apparatus 1 with reference to FIGS. 1 to 7.

Firstly, the cooling fan device 3 is inserted into the resilient member 10 through the inserting portion 16 and the cooling fan device 3 is then covered with the resilient member 10 to have the front resilient portion 10a and the rear resilient portion 10b of the resilient member 10 respectively held in resiliently pressing contact with the front surface 11a and the rear surface 11b of the housing 11 of the cooling fan device 3, the top resilient portion 10c and the bottom resilient portion 10d of the resilient member 10 respectively held in resiliently pressing contact with the top surface 11c and the bottom surface 11d of the housing 11, and the side resilient portions 10e and 10f of the resilient member 10 respectively held in resiliently pressing contact with the side surfaces 11e and 11f of the housing 11.

Secondly, the cooling fan device 3 thus covered with the resilient member 10 is temporally positioned on the first holding section 70 of the mounting plate 7 to have the front surface portion 71 of the first holding section 70 held in pressing contact with the front surface 11a of the housing 11, the bottom surface portion 72 of the first holding section 70 held in pressing contact with the bottom surface 11d of the housing 11, the side surface portions 73 and 74 of the first holding section 70 held in pressing contact with the side surfaces 11e and 11f of the housing 11 under the state that the mounting plate 7 has the DVD player 5 mounted thereon.

Thirdly, the cooling fan device 3 thus temporally positioned on the first holding section 70 is covered with the second holding section 80 of the supporting plate 8 to have the rear surface portion 83 of the second holding section 80 held in pressing contact with the rear surface 11b of the housing 11, the top surface portion 84 of the second holding section 80 held in pressing contact with the top surface 11c of the housing 11 of the housing 11.

Fourthly, the supporting plate 8 is screwed to the side panels 4F and 4G at the screw points 19C and to the lower panel 4C at the screw points 19D under the state that the first holding section 70 and the second holding section 80 collectively form the holding portion having the cooling fan device 3 resiliently held therein. At least one of the side surfaces 11e and 11f is opposing to and held in pressing contact with both of the first holding section 70 of the mounting plate 7 and the second holding section 80 of the supporting plate 8. In the present embodiment, the side surface portions 81 and 82 of the second holding section 80 is opposing to and held in pressing contact with the side surface portions 73 and 74 of the first holding section 70 held in pressing contact with the side surfaces 11e and 11f of the housing 11. Further, the mounting plate 7 is fixedly connected with the supporting plate 8 under the state that the cooling fan device 3 and the resilient member 10 are intervening between and supported by the mounting plate 7 and the supporting plate 8. In the present embodiment, the upper panel 4A is screwed to the side plates 4F and 4G, the front panel 4D and the mounting plate 7 at respective screw points 19F, as described hereinearlier. The rear panel 4E of the housing 4 is constituted by a supporting plate 8, as described hereinearlier. This leads to the fact that the mounting plate 7 is fixedly connected with the supporting plate 8 under the state that the cooling fan device 3 and the resilient member 10 are intervening between and supported by the mounting plate 7 and the supporting plate 8.

In the electronic apparatus 1 according to the present invention, the resilient member 10 has an inserting portion 16 to have the cooling fan device 3 slidably received therethrough. This means that the electronic apparatus 1 according to the present invention thus constructed can makes it easy for the cooling fan device 3 to be inserted into the resilient member 10. This leads to the fact that the electronic apparatus 1 thus constructed is simple in construction and easy to assemble. The electronic apparatus 1 according to the present invention, in which the mounting plate 7 includes a first holding section 70, the supporting plate 8 includes a second holding section 80, the first holding section 70 and the second holding section 80 collectively serve as the holding portion, the cooling fan device 3 has a first contact surface 11a and a second contact surface 11b opposing to and spaced apart from each other, a top surface 11c and a bottom surface 11d opposing to and spaced apart from each other and substantially in perpendicular relationship with the first contact surface 11a, and a pair of side surfaces 11e and 11f opposing to and spaced apart from each other and substantially in perpendicular relationship with the first contact surface 11a and the bottom surface 11d, the first contact surface 11a, the side surfaces 11e and 11f, and the bottom surface 11d are opposing to and held in pressing contact with the first holding section 70 of the mounting plate 7, and the second contact surface 11b and the top surface 11c are opposing to and held in pressing contact with the second holding section 80 of the supporting plate 8, makes it easy for the cooling fan device 3 to be temporally positioned on the first holding section 70 of the mounting plate 7 and the second holding section 80 of the supporting plate 8 before the supporting plate 8 is fixedly connected with the housing 4. This leads to the fact that the electronic apparatus 1 thus constructed is simple in construction and easy to assemble.

Furthermore, at least one of the side surfaces 11e and 11f is opposing to and held in pressing contact with both of the first holding section 70 of the mounting plate 7 and the second holding section 80 of the supporting plate 8 in the electronic apparatus 1 according to the present invention. This means that the electronic apparatus 1 according to the present invention makes it easy for the cooling fan device 3 to be temporally positioned on the first holding section 70 of the mounting plate 7 and the second holding section 80 of the supporting plate 8 laterally with respect to at least one of the side surfaces 11e and 11f of the housing 11 of the cooling fan device 3 before the supporting plate 8 is fixedly connected with the housing 4. This leads to the fact that the electronic apparatus 1 thus constructed is simple in construction and easy to assemble.

The description hereinlater will be directed to the operation of the cooling fan device 3 thus intervening between and supported by the mounting plate 7 and the supporting plate 8 forming part of the electronic apparatus 1 with reference to FIGS. 1 to 5.

The cooling fan device 3 is operated to exhaust the air in the housing 4 through the through bore 77 of the mounting plate 7 and the through bore 85 of the supporting plate 8 to cool the elements and parts forming part of the electronic device 5. The cooling fan device 3 vibrates while the cooling fan device is driven to ventilate the housing 4. The resilient member 10 disposed between the cooling fan device 3 and the mounting plate 7 and between the cooling fan device 3 and the supporting plate 8 is operated to absorb the vibrations of the cooling fan device 3 while the cooling fan device 3 is being driven to ventilate the housing 4 to cool the elements and parts forming part of the electronic device 5. Furthermore, the electronic apparatus 1 thus constructed is operated to permit the cooling fan of the cooling fan device 3 only to exhaust the air heated by the electronic device 5 in the housing 4, thereby preventing the cooling fan of the cooling fan device 3 from blowing the air heated by the electronic device 5 into the housing 4 and heating the elements and parts forming part of the electronic device 5. This leads to the fact that the electronic apparatus 1 according to the present invention makes it possible for the cooling fan device 3 to cool the elements and parts forming part of the electronic device 5 in the housing 4.

As will be seen from the foregoing description, it is to be understood that the electronic apparatus 1 according to the present invention, comprising: a housing 4; a mounting plate 7 having an electronic device 5 mounted thereon and fixedly connected with the housing 4, the mounting plate 7 being formed with a through bore 77; a supporting plate 8 fixedly connected with at least one of the housing 4 and the mounting plate 7 and formed with a through bore 85; a cooling fan device 3 intervening between and supported by the mounting plate 7 and the supporting plate 8, and adapted to ventilate the housing 4 through the through bore 77 of the mounting plate 7 and the through bore 85 of the supporting plate 8; and a resilient member 10 disposed between the cooling fan device 3 and the mounting plate 7 and between the cooling fan device 3 and the supporting plate 8 to absorb the vibrations of the cooling fan device 3 while the cooling fan device 3 is being driven to ventilate the housing 4 to cool the electronic device 5, can reduce noises caused by the vibration of the cooling fan device. This leads to the fact that the electronic apparatus 1 thus constructed is noiseless in operation. Furthermore, the electronic apparatus 1, in which the cooling fan device is intervening between and supported by the mounting plate 7 and the supporting plate 8, can reduce the need of the fastening screw or the solder portion. This means that the electronic apparatus 1 according to the present invention is simple in construction and easy to assemble.

In the electronic apparatus 1 according to the present invention, the mounting plate 7 is fixedly connected with the supporting plate 8 under the state that the cooling fan device 3 and the resilient member 10 are intervening between and supported by the mounting plate 7 and the supporting plate 8, and at least one of the side surfaces 11e and 11f of the cooling fan device 3 is opposing to and held in pressing contact with both of the first holding section 70 of the mounting plate 7 and the second holding section 80 of the supporting plate 8. This leads to the fact that the electronic apparatus 1 according to the present invention can enhance the strength of first holding section 70 and the second holding section 80, thereby enabling to reduce the thickness of the mounting plate 7 and thus save the cost of the electronic apparatus 1.

In the electronic apparatus 1 according to the present invention, the electronic apparatus 1 according to the present invention can absorb the vibration of the cooling fan device 3, thereby reducing noises caused by the vibration of the cooling fan device 3 and unpleasant to passengers' ears in the automotive vehicle. Furthermore, the electronic device 5 is to be mounted on an automotive vehicle. The electronic apparatus 1 thus constructed can absorb the vibrations caused by the automotive vehicle while the automotive vehicle is cruising. This means that the electronic apparatus 1 according to the present invention can prevent fastening elements forming part of the electronic apparatus 1 such as, for example, fastening screws from being loosened.

Though it has been described in the above that the resilient member 10 includes a plurality of resilient portions integrally formed with one another, the resilient member 10 may include a plurality of resilient portions separated from one another as long as the resilient member 10 can absorb the vibrations of the cooling fan device 3 while the cooling fan device 3 is being driven to ventilate the housing 4.

While the present invention has thus been shown and described with reference to the specific embodiments, however, it should be noted that the invention is not limited to the details of the illustrated structures but changes and modifications may be made without departing from the scope of the appended claims.

What is claimed is:

1. An electronic apparatus, comprising: a housing; a mounting plate having an electronic device mounted thereon and fixedly connected with said housing, said mounting plate being formed with a through bore; a supporting plate fixedly connected with at least one of said housing and said mounting plate and formed with a through bore; a cooling fan device intervening between and supported by said mounting plate and said supporting plate, and adapted to ventilate said housing through said through bore of said mounting plate and said through bore of said supporting plate; and a resilient member disposed between said cooling fan device and said mounting plate and between said cooling fan device and said supporting plate to absorb vibrations of said cooling fan device while said cooling fan device is being driven to ventilate said housing to cool said electronic device, and in which said cooling fan device has a first surface and a second surface opposing to and spaced apart from each other, said mounting plate and said supporting plate have respective complementary portions forming in cooperation a holding portion for holding said cooling fan device, and at least said first surface and said second surface of said cooling fan device are opposing to and held in resiliently pressing contact with said holding portion with said resilient member disposed therebetween, said mounting plate includes a first holding section, said supporting plate includes a second holding section, said first holding section and said second holding section collectively serve as said holding portion, said cooling fan device has a first contact surface and a second contact surface opposing to and spaced apart from each other, a top surface and a bottom surface opposing to and spaced apart from each other and substantially in perpendicular relationship with said first contact surface, and a pair of side surfaces opposing to and spaced apart from each other and substantially in perpendicular relationship with said first contact surface and said bottom surface, said first contact surface, said side surfaces, and said bottom surface are opposing to and held in pressing contact with said first holding section of said mounting plate, and said second contact surface and said top surface are opposing to and held in pressing contact with said second holding section of said supporting plate.

2. An electronic apparatus as set forth in claim 1, in which at least one of said side surfaces is opposing to and held in pressing contact with both of said first holding section of said mounting plate and said second holding section of said supporting plate.

3. An electronic apparatus as set forth in claim 1, in which said mounting plate is fixedly connected with said supporting plate under the state that said cooling fan device and said resilient member are intervening between and supported by said mounting plate and said supporting plate.

4. An electronic apparatus as set forth in claim 1, in which said housing is partly constituted by one of said mounting plate and said supporting plate.

5. An electronic apparatus as set forth in claim 4, in which said one of said mounting plate and said supporting plate constitutes a plane of said housing, and said plane has a base portion and a protruded portion integrally formed with and protruded outwardly of said base portion to have said cooling fan device partly received therein.

6. An electronic apparatus as set forth in claim 1, in which said resilient member has a first resilient portion disposed between said cooling fan device and said mounting plate and a second resilient portion disposed between said cooling fan device and said supporting plate, and said first resilient portion and said second resilient portion are connected with each other.

7. An electronic apparatus as set forth in claim 1, in which said resilient member has an inserting portion to have said cooling fan device slidably received therethrough.

8. An electronic apparatus as set forth in claim 1, in which said cooling fan device is operative to exhaust air in said housing.

9. An electronic apparatus as set forth in claim 1, in which said electronic device is a disk drive unit.

10. An electronic apparatus as set forth in claim 1, in which said electronic apparatus is to be assembled in a vehicle.

* * * * *